United States Patent [19]
Takemae et al.

[11] Patent Number: 4,592,025
[45] Date of Patent: May 27, 1986

[54] INFORMATION STORING CIRCUIT USING BLOWN AND UNBLOWN FUSES

[75] Inventors: Yoshihiro Takemae; Junji Ogawa, both of Tokyo; Yasuhiro Fujii, Yokohama; Tomio Nakano, Kawasaki; Takeo Tatematsu, Yokohama; Takashi Horii; Masao Nakano, both of Kawasaki all of Japan; Norihisa Tsuge, deceased, late of Kamakura, Japan, by Itaru Tsuge, Sachie Tsuge, heirs

[73] Assignee: Fujitsu Limited, Kawasaki, Japan

[21] Appl. No.: 598,742

[22] Filed: Apr. 10, 1984

[30] Foreign Application Priority Data

Nov. 10, 1983 [JP] Japan ................................ 58-209860

[51] Int. Cl.$^4$ .............................................. G11C 7/00
[52] U.S. Cl. ...................................... 365/200; 365/96
[58] Field of Search .................... 365/94, 96, 200, 189, 365/230

[56] References Cited

U.S. PATENT DOCUMENTS 4,250,570  2/1981  Tsang et al. ........................ 365/200
4,432,070  2/1984  Moss .................................... 365/96

OTHER PUBLICATIONS

Electronics, Redundancy, "What to do When the Bits Go Out", John G. Posa, Jul. 28, 1981, pp. 117-134.

Primary Examiner—Joseph A. Popek
Attorney, Agent, or Firm—Staas & Halsey

[57] ABSTRACT

A circuit for storing information by blown and unblown fuses has at least two fuses per bit and an information output circuit. The information output circuit discriminates between the state in which all the fuses are unblown and the state in which at least one of the fuses is blown, and provides an output in accordance with the result of the discrimination as stored information.

19 Claims, 15 Drawing Figures

INFORMATION STORING CIRCUIT USING BLOWN AND UNBLOWN FUSES

BACKGROUND OF THE INVENTION

1. Field of the Invention

The present invention relates to an information storing circuit using blown and unblown fuses for use in, for example, a redundancy circuit of a large capacity random access memory (RAM) device, or a trimming circuit of an integrated circuit device.

2. Description of the Prior Art

In a RAM device, a large number of memory cells are arranged along rows and columns. The density of defects generated in such a semiconductor memory device during the manufacture thereof is relatively independent of the integration density of the device. Rather, it derives from the semiconductor manufacturing technology. In general, the higher the integration density of the device, the greater the ratio of normal memory cells to defective memory cells. This is one of the advantages of increasing the integration density of a semiconductor memory device.

Even if a device includes only one defective memory cell, however, the device cannot be operated normally and, therefore, must be scrapped. As a result, despite the lower ratio of defective memory cells, greater integration density means reduced manufacturing yield.

To overcome the problem of defective memory cells, use is made of redundancy memory cells. When a defective memory cell is detected, a redundancy memory cell row or column is selected instead of the memory cell row or column including the defective memory cell. In general, one or two redundancy memory cell rows or columns are usually provided.

In such a redundancy configuration, in order to store address information of such a defective row or column and to disable regular decoders for selecting normal memory cells so as to select the redundancy row or column in response to an address of the defective row or column, a redundancy control circuit is provided. A redundancy control circuit comprises fuse-type read-only memories (ROM's) each having an information storing circuit.

A unit information storing circuit in prior art devices incorporates only one fuse for each one bit of information to be stored. Therefore, the information storing circuit stores data "1" or "0" by a blown fuse or an unblown fuse. For example, when writing data "1", a polycrystalline silicon fuse is blown by electrical programming or laser programming upon completion of the major part of the manufacturing process of the device, and the succeeding testing process by which the defective rows or columns are detected and the writing data is determined. However, as will be explained later in more detail, there is a relatively large probability of recovery of a polycrystalline silicon fuse from the blown to unblown state during the life of the device. Accordingly, there is also a relatively large probability of change of data stored in the information storing circuit from "1" to "0", thereby reducing the reliability of the information storing circuit.

SUMMARY OF THE INVENTION

It is an object of the present invention to provide a reliable information storing circuit.

According to the present invention, each unit information storing circuit for storing one bit information comprises a plurality of, e.g., two, fuses. In this unit information storing circuit, data "0" is determined by the state wherein all the fuses are in an unblown state; and data "1" is determined by a state wherein at least one of the fuses is in a blown state, while in the programming process no fuse is blown to store "0" and all the fuses are blown to store "1". Note that, even if there is a relatively large probability of recovery of one fuse from the blown to unblown state, there is a considerably small probability of simultaneous recovery of two or more fuses, and also the possibility of the change from the unblown to blown state in the normal operation of the device is negligible. Therefore, there is only a small probability of change of data stored in the information storing circuit from "1" to "0", and vice versa, thereby improving the reliability of the information storing circuit.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
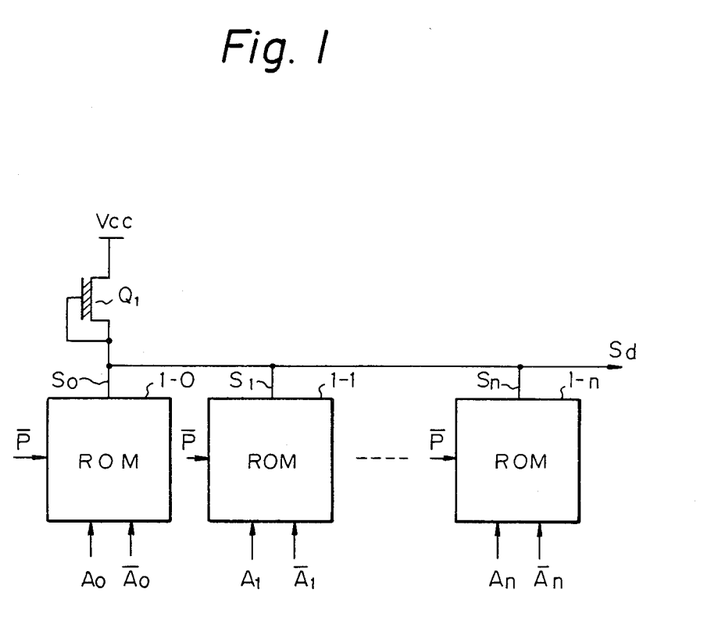
FIG. 1 is a block circuit diagram of a general redundancy control circuit.

FIG. 1 illustrates a general redundancy control circuit. The redundancy control circuit is comprised of fuse-type ROM's 1-0, 1-1, ..., and 1-n each receiving address signals $A_0$, $\overline{A}_0$; $A_1$, $\overline{A}_1$; ...; and $A_n$, $\overline{A}_n$, respectively. Each ROM comprises one fuse which is blown or unblown in accordance with a corresponding one bit information of an address corresponding to a defective row or column (hereinafter referred to as a defective address) and makes its internal logic switching transistor connected to one of the outputs $S_0$, $S_1$, ..., $S_n$ non-conductive upon coincidence of the information and its corresponding one bit of address signals. Therefore, when an input address defined by the address signals $A_0$, $\overline{A}_0$, $A_1$, $\overline{A}_1$, ..., and $A_n$, $\overline{A}_n$ corresponds to the defective address, all the outputs $S_0$, $S_1$, ..., and $S_n$ of the ROM's 1-0, 1-1, ..., and 1-n become a high level, so that the output $S_d$ of the redundancy control circuit becomes a high level. In response to the high level of the output $S_d$, all the regular decoders (not shown) for the normal memory cells are disabled and, in addition, the redundancy row or column is selected. Conversely, when some pair of such address signals such as $A_0$ and $\overline{A}_0$, are different from the content stored in the ROM 1-0, its output $S_0$ becomes a low level. In this case, the conductivity of the depletion-type transistor $Q_1$ serving as a load is adjusted so that the output $S_d$ of the redundancy control circuit becomes a low level. As a result, the regular decoders for the normal memory cells are not disabled, and, in addition, the redundancy row or column is not selected. Thus, replacement of the defective normal memory cells by a redundancy row or column is carried out.

Figure 2:
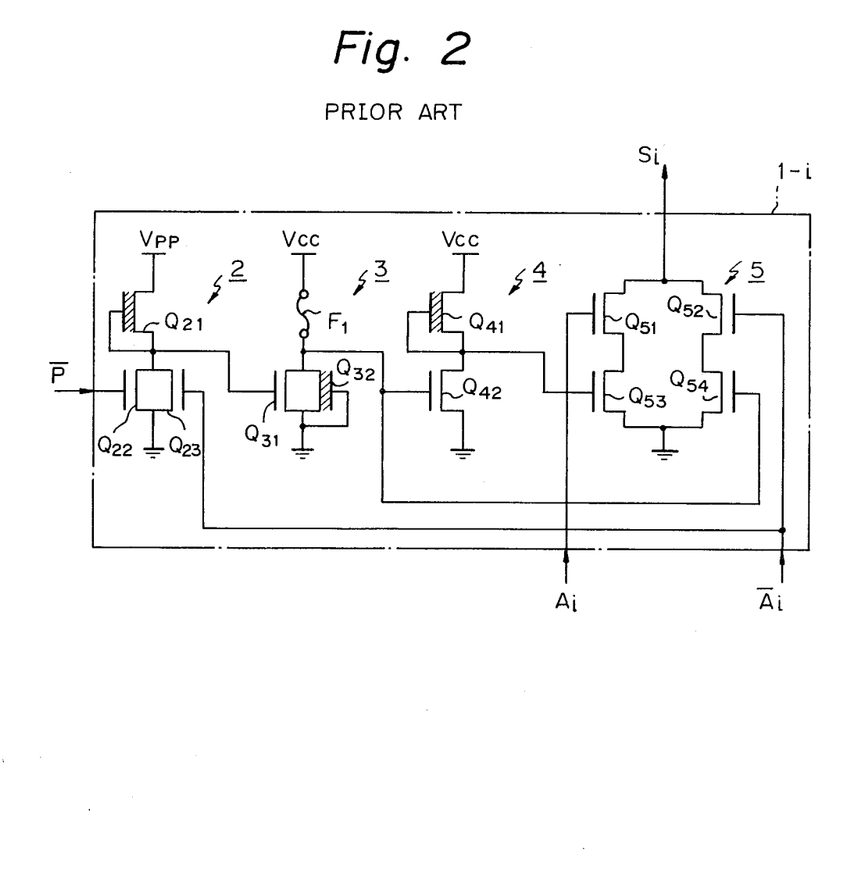
FIGS. 2 and 3 are circuit diagrams of a fuse-type ROM including a prior art information storing circuit.

An example of prior art ROM 1-i is shown in FIG. 2 (see: Electronics, July 28, 1981, p. 129). In FIG. 2, a programming circuit 2 comprises a depletion-type transistor $Q_{21}$, an enhancement-type transistor $Q_{22}$ for receiving a program signal $\overline{P}$, and an enhancement-type transistor $Q_{23}$ for receiving an address signal $\overline{A}_i$. An information storing circuit 3 comprises a fuse $F_1$, an enhancement-type transistor $Q_{31}$ turned on by the programming circuit 2, and a depletion-type transistor $Q_{32}$ serving as a load. An inverter 4 comprises a depletion-type transistor $Q_{41}$, serving as a load, and an enhancement-type transistor $Q_{42}$. An address coincidence detecting circuit 5 comprises enhancement-type transistors $Q_{51}$ and $Q_{52}$ for receiving address signals $A_i$ and $\overline{A}_i$, respectively, an enhancement-type transistor $Q_{53}$ for receiving an output of the information storing circuit 3 via the inverter circuit 4, and an enhancement-type transistor $Q_{54}$ for receiving the output of the information storing circuit 3.

In FIG. 2, when the program signal $\overline{P}$ and the address $\overline{A}_i$ are both low, the transistor $Q_{31}$ is turned on so as to pass a large current to the fuse $F_1$, thereby blowing the fuse $F_1$. Thus, writing of data "1" is carried out. When the output of the information storing circuit 3 coincides with the address signals $A_i$ and $\overline{A}_i$, the address coincidence detecting circuit 5 generates a high level output signal $S_i$.

In FIG. 2, note $V_{PP} > V_{CC}$, in order to completely turn on the transistor $Q_{31}$ when the transistors $Q_{22}$ and $Q_{23}$ are both cut off.

Figure 3:
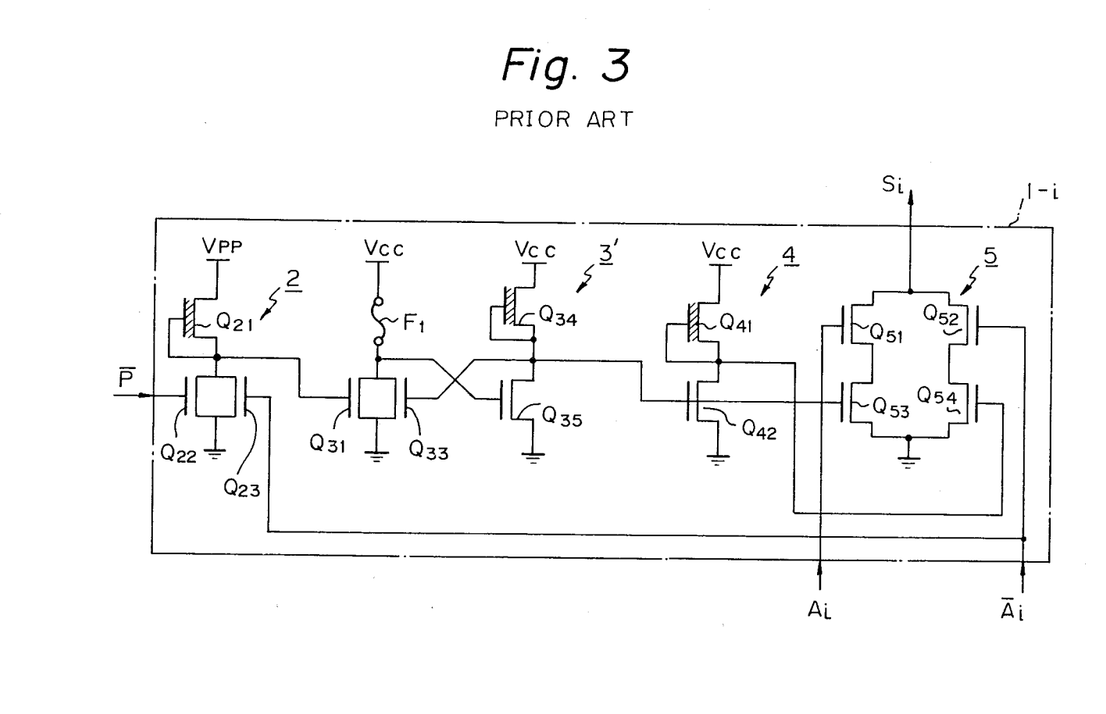

Another example of prior art ROM 1-i is illustrated in FIG. 3 (see: Electronics, July 28, P. 123). In FIG. 3, an information storing circuit 3' comprises a latch circuit. That is, an enhancement-type transistor $Q_{33}$, a depletion-type transistor $Q_{34}$, and an enhancement-type transistor $Q_{35}$ are provided instead of the depletion-type transistor $Q_{32}$ of FIG. 2, thereby increasing the tolerance of the ratio of the blown and unblown resistances of the fuse $F_1$.

In FIG. 3, note the inverter 4 can be omitted. In this case, the gate of the transistor $Q_{53}$ is connected directly to the fuse $F_1$. However, the inverter 4 is indispensable in FIG. 7, which will be later explained.

Figure 4:
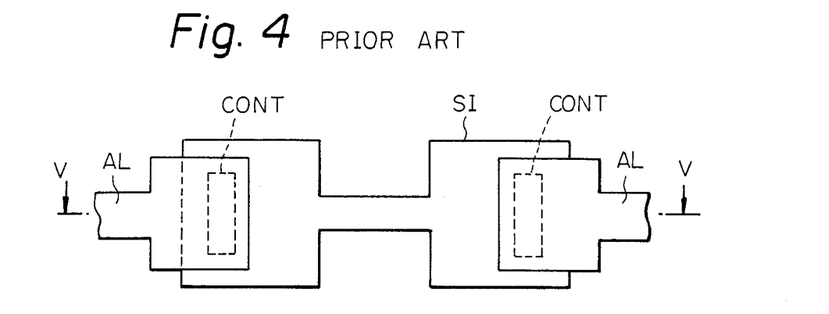
FIG. 4 is a plan view of the fuse of FIGS. 2 and 3.
Figure 5A:
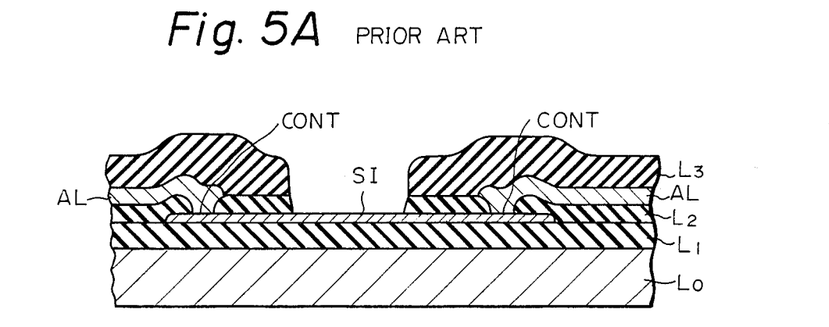
FIGS. 5A and 5B are cross-sectional views taken along the V—V line of FIG. 4.

The fuse $F_1$ as shown in FIGS. 2 and 3 is comprised of, for example, a polycrystalline silicon layer SI, as illustrated in FIG. 4. The polycrystalline silicon layer SI is connected via a contact area CONT to an aluminum layer AL serving as a conductive layer. The blowing portion of the fuse $F_1$ is, for example, 2 $\mu$m wide and 8 $\mu$m long. As illustrated in FIG. 5A, at the blowing portion, the polycrystalline silicon layer SI is exposed so as to evaporate the blown polycrystalline silicon during a blowing step, thereby avoiding retrieval of the connection, i.e., recovery from the blowing state to the unblown state. In this case, however, contaminants such as sodium ions penetrating into a monocrystalline silicon substrate $L_0$ increase so as to interfere with the circuit operation.

Figure 5B:
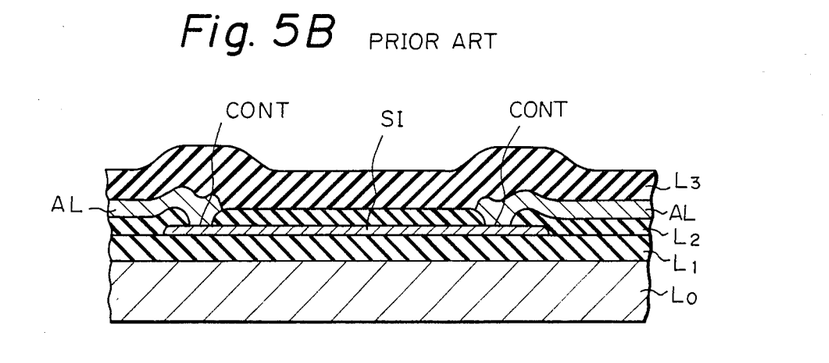

On the other hand, as illustrated in FIG. 5B, blowing can be carried out while covering the blowing portion with an insulating layer. In this case, however, the polycrystalline silicon of the blowing portion may not complete its evaporation, thereby increasing the risk of the retrieval of the blown polycrystalline silicon.

In any case, the possibility of change of 2 $\mu$m wide polycrystalline silicon from the unblown to blown state is very small and negligible, even if a current of about 1 to 10 $\mu$A flows through such silicon. This is because, in conventional circuits using 2 $\mu$m wide polycrystalline silicon layers, even though currents of about 100 $\mu$A to 1 mA, considerably larger than 1 to 10 $\mu$A, are often supplied to such polycrystalline silicon layers, which are employed to form, for example, gate wirings in the circuit, no problem regarding blowing or change of resistance values occurs. Conversely, the possibility of change of the polycrystalline silicon from the blown to unblown state is relatively large, due to the speciality of the blowing phenomenon and the non-uniformity of shape of the blown polycrystalline silicon. For example, after blowing, the gap in the fuse establishing the disconnection state is often small (several 100 Å). The high voltage applied thereto creates a strong electric field which causes a slow "flow" of the conductive material. This eventually can cause a short-circuited state, i.e., an unblown state.

In FIGS. 5A and 5B, note that $L_1$, $L_2$, and $L_3$ designate insulating layers such as silicon dioxide ($SiO_2$) or phosphosilicate glass (PSG).

Thus, in the information storing circuit as illustrated in FIGS. 2 or 3, the possibility of change from data "1" to data "0" is relatively large, since data "1" depends upon a blown state of only one fuse.

The present invention relates to an improvement of the information storing circuit 3 of FIG. 2 and the information storing circuit 3' of FIG. 3.

Figure 6A:
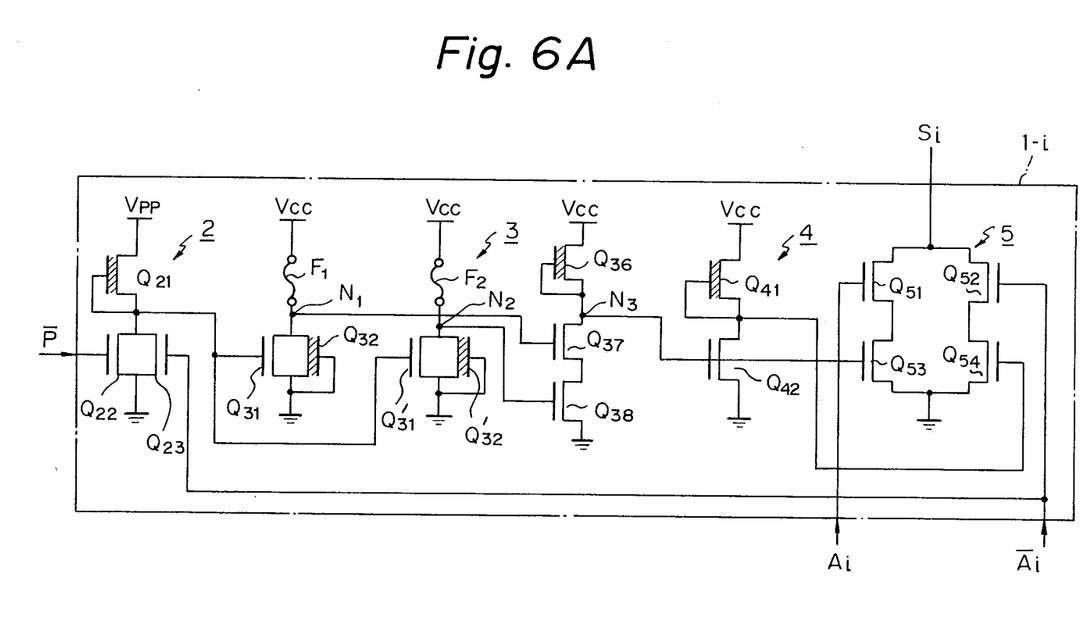
FIG. 6A is a circuit diagram of a fuse-type ROM including a first embodiment of the information storing circuit according to the present invention.

In FIG. 6A, which illustrates a first embodiment of the present invention, elements $F_2$, $Q_{31}'$, $Q_{32}'$, $Q_{36}$, $Q_{37}$, and $Q_{38}$ are added to the elements of FIG. 2. A fuse circuit formed by the fuse $F_2$ and the transistors $Q_{31}'$ and $Q_{32}'$ is the same as the fuse circuit formed by the fuse $F_1$, and the transistors $Q_{31}$ and $Q_{32}$. The depletion-type transistor $Q_{36}$ and the enhancement-type transistors $Q_{37}$ and $Q_{38}$ constitute a NAND gate circuit, which serves as an information output means.

When the fuses $F_1$ and $F_2$ are both in an unblown state, the potentials at the nodes $N_1$ and $N_2$ are both high. Accordingly, the transistors $Q_{37}$ and $Q_{38}$ are both in an on state. As a result, the potential at the node $N_3$ is low.

When one of the fuses, such as $F_1$, is in an unblown state and the other, e.g., $F_2$, is in a blown state, the potential at the node $N_1$ is high and the potential at the node $N_2$ is low, so that the transistor $Q_{37}$ is in an on state and the transistor $Q_{38}$ is in an off state. As a result, the potential at the node $N_3$ is high.

Further, when the fuses $F_1$ and $F_2$ are both in a blown state, the potentials at the nodes $N_1$ and $N_2$ are both low. Therefore, the transistors $Q_{37}$ and $Q_{38}$ are both in an off state, so that the potential at the node $N_3$ is high.

Thus, when one or both of the fuses $F_1$ and $F_2$ is in a blown state, the potential at the output node $N_3$ of the NAND circuit is high. In other words, in the writing process, blowing of one or more fuses means completion of the writing of data "1". In addition, when the fuses $F_1$ and $F_2$ are both blown, data "1" will not return to data "0" even if one fuse returns to an unblown state. That is until both the fuses return to an unblown state, such data "1" will not return to data "0".

Therefore, if the probability P of returning a fuse from the blown state to the unblown state is, for example, P=0.01 (1%), the probability of two fuses returning from the blown state to the unblown state is $P^2=0.00001$, remarkably reducing the probability of change from data "1" to data "0". As a result, the reliability of the information storing circuit is improved.

Figure 6B:
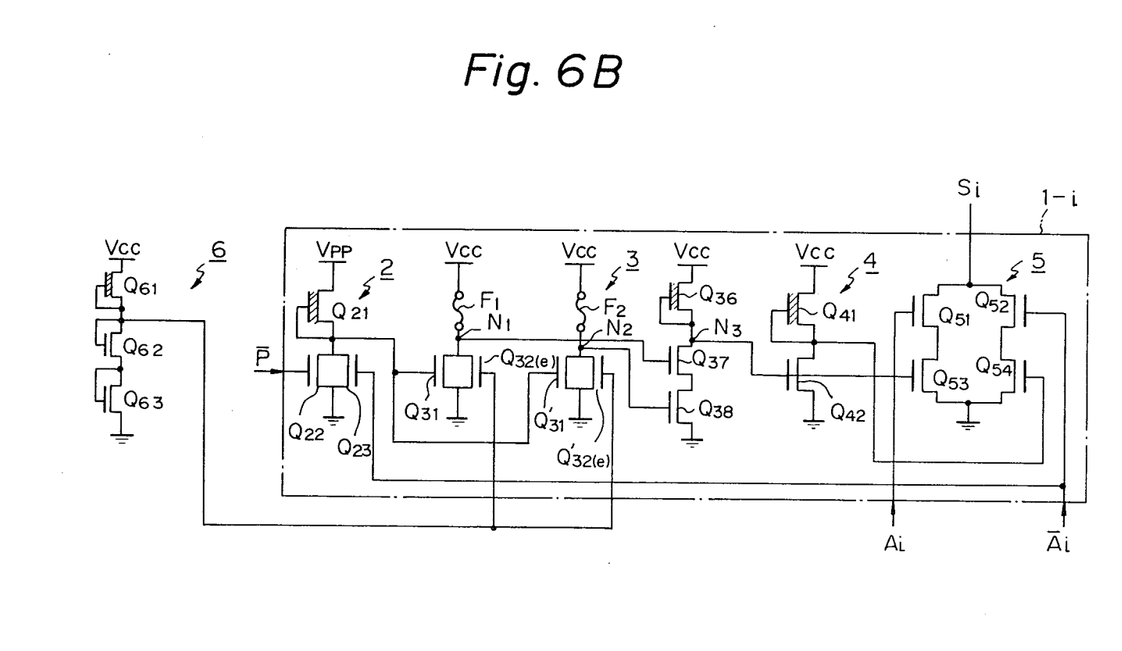
FIGS. 6B, 6C, and 6D, are modifications of FIG. 6A.

FIG. 6B is a modification of FIG. 6A. In FIG. 6A, the load depletion-type transistors $Q_{32}$ and $Q_{32}'$ are connected in series to the fuses $F_1$ and $F_2$, respectively. In this case, however, in order to reduce the currents flowing through these transistors, the channel length thereof has to be long, for example, several tens of $\mu m$ to several hundreds of $\mu m$, thereby increasing the area occupied by these transistors. In order to improve this, in FIG. 6B, the transistors $Q_{32}$ and $Q_{32}'$ are made enhancement-types to which a voltage from a portion other than the ROM is applied. Control of the voltage applied to the gates of the enhancement-type transistors $Q_{32}(e)$ and $Q_{32}'(e)$ can reduce the currents flowing through the transistors $Q_{32}(e)$ and $Q_{32}'(e)$ even when the channel length of these transistors is relatively small. In FIG. 6B, the voltage applied to the transistors $Q_{32}(e)$ and $Q_{32}'(e)$ is a definite value lower than the voltage of the power supply ($V_{CC}$) such as 2 $V_{th}$ generated by a circuit 6 comprising a depletion-type transistor $Q_{61}$ and enhancement-type transistors $Q_{62}$ and $Q_{63}$. Here, $V_{th}$ is a threshold voltage of the transistors $Q_{62}$ and $Q_{63}$.

Figure 6C:
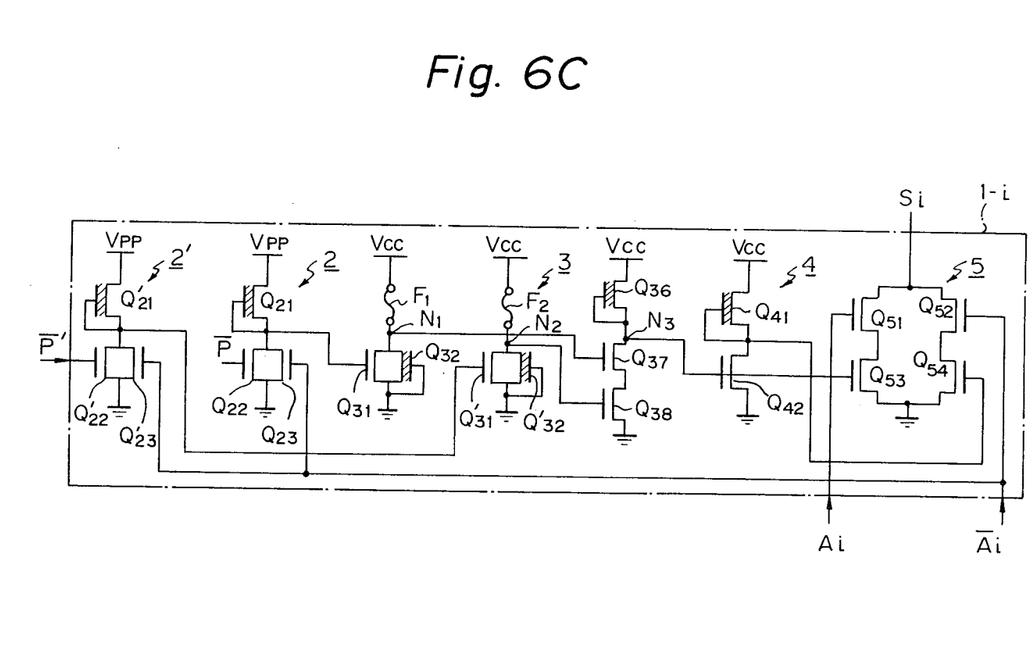

FIG. 6C is another modification of FIG. 6A. In FIG. 6A, the fuses $F_1$ and $F_2$ are blown simultaneously. That is, the gates of the transistors $Q_{31}$ and $Q_{31}'$ receive the same voltage during a blowing mode. Generally, during a blowing mode, a current of several tens of mA to several hundreds of mA flows through one fuse. Therefore, when two fuses are simultaneously blown, a large current flows through and has a harmful effect on the aluminum wiring. In order to avoid this, in FIG. 6C, another programming circuit 2' is provided. The signals from the circuits 2 and 2' are applied to the gates of the transistors $Q_{31}$ and $Q_{31}'$, respectively. Selection of the fuse to be blown is controlled by voltages at the terminals $\overline{P}$ and $\overline{P}'$. Thus, the problem of FIG. 6A is solved.

Figure 6D:
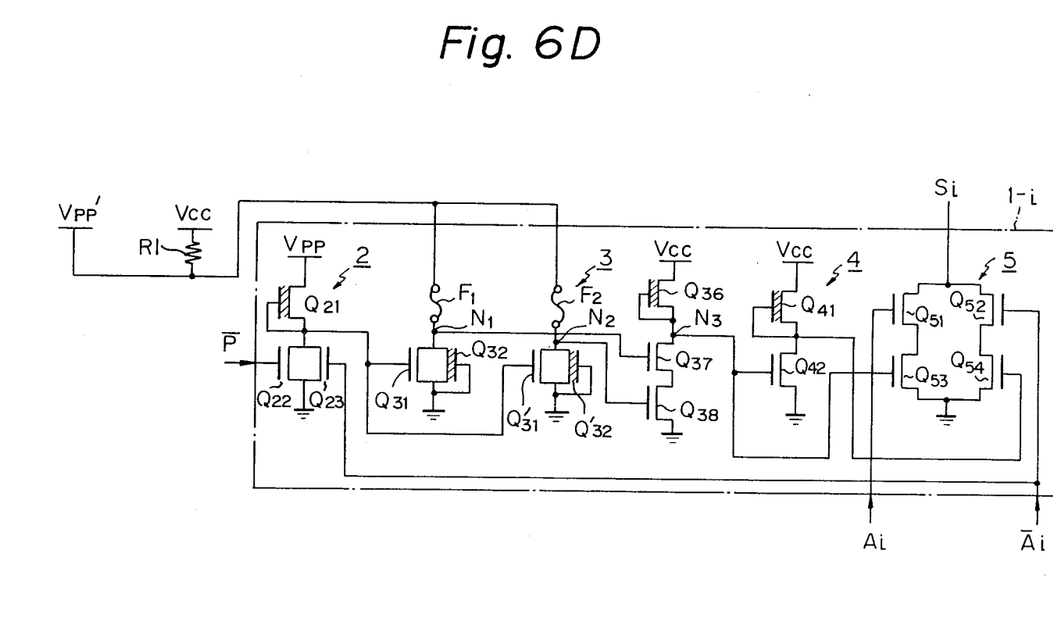

FIG. 6D is still another modification of FIG. 6A. In FIG. 6A, during a blowing mode of the fuses $F_1$ and $F_2$, the voltage applied to the fuses $F_1$ and $F_2$ is a power supply voltage $V_{CC}$ used in the conventional circuit, which voltage is generally 5 V. However, a voltage of 5 V applied to the fuses $F_1$ and $F_2$ is often insufficient to generate sufficient heat, i.e., electric power. Therefore, in FIG. 6D, $V_{PP}'$ instead of $V_{CC}$ ($V_{PP}' < V_{CC}$) is connected to the fuses $F_1$ and $F_2$, thereby giving a sufficiently high voltage to the fuses during a blowing mode. Note that, in a normal state, $V_{CC}$ is applied via a resistor $R_1$ to the fuses $F_1$ and $F_2$.

Figure 7:
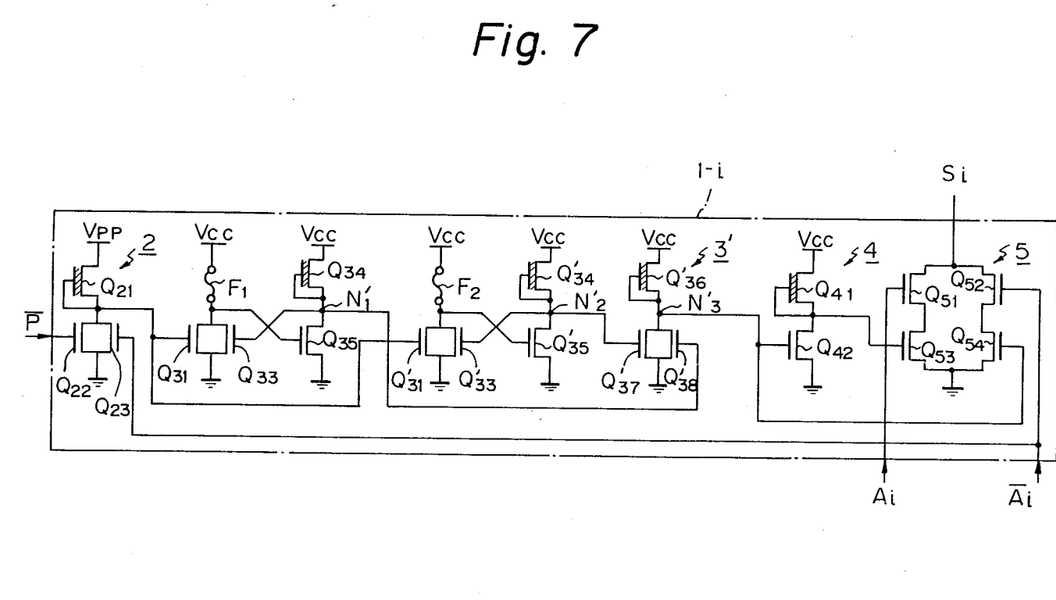
FIG. 7 is a circuit diagram of a fuse-type ROM including a second embodiment of the information storing circuit according to the present invention.

In FIG. 7, which illustrates a second embodiment of the present invention, elements $F_2$, $Q_{31}'$, $Q_{33}'$, $Q_{34}'$, $Q_{35}'$, $Q_{36}'$, $Q_{37}'$, and $Q_{38}'$, are added to the elements of FIG. 3. A fuse circuit formed by the fuse $F_2$ and the transistors $Q_{31}'$, $Q_{33}'$, $Q_{34}'$, and $Q_{35}'$ is the same as the fuse circuit formed by the fuse $F_1$, and the transistors $Q_{31}$, $Q_{33}$, $Q_{34}$, and $Q_{35}$. The depletion-type transistor $Q_{36}'$ and the enhancement-type transistors $Q_{37}'$ and $Q_{38}'$ constitute a NOR gate circuit which serves as an information output means.

When the fuses $F_1$ and $F_2$ are both in an unblown state, the potentials at the nodes $N_1'$ and $N_2'$ are both low. Accordingly, the transistors $Q_{37}'$ and $Q_{38}'$ are both in an off state. As a result, the potential at the node $N_3'$ is high.

When one of the fuses, such as $F_1$, is in an unblown state and the other, e.g., $F_2$ is in a blown state, the potential at the node $N_1'$ is low and the potential at the node $N_2'$ is high so that the transistor $Q_{37}'$ is in an on state and the transistor $Q_{38}'$ is in an off state. As a result, the potential at the node $N_3'$ is low.

Further, when the fuses $F_1$ and $F_2$ are both in a blown state, the potentials at the nodes $N_1'$ and $N_2'$ are both high. Therefore, the transistors $Q_{37}'$ and $Q_{38}'$ are both in an on state, so that the potential at the node $N_3'$ is low.

Thus, when one or both of the fuses $F_1$ and $F_2$ is in a blown state, the potential at the output node $N_3'$ of the NOR circuit is low. Therefore, also in this case, in the writing operation, blowing of one or both fuses means completion of the writing of data "1". In addition, when the fuses $F_1$ and $F_2$ are both blown, data "1" will not return to data "0" even if one fuse returns to an unblown state. That is, until both the fuses return to an unblown state, such data "1" will not return to data "0".

Note that the modifications illustrated in FIGS. 6C and 6D can be also applied to the embodiment of FIG. 7.

Figure 8:
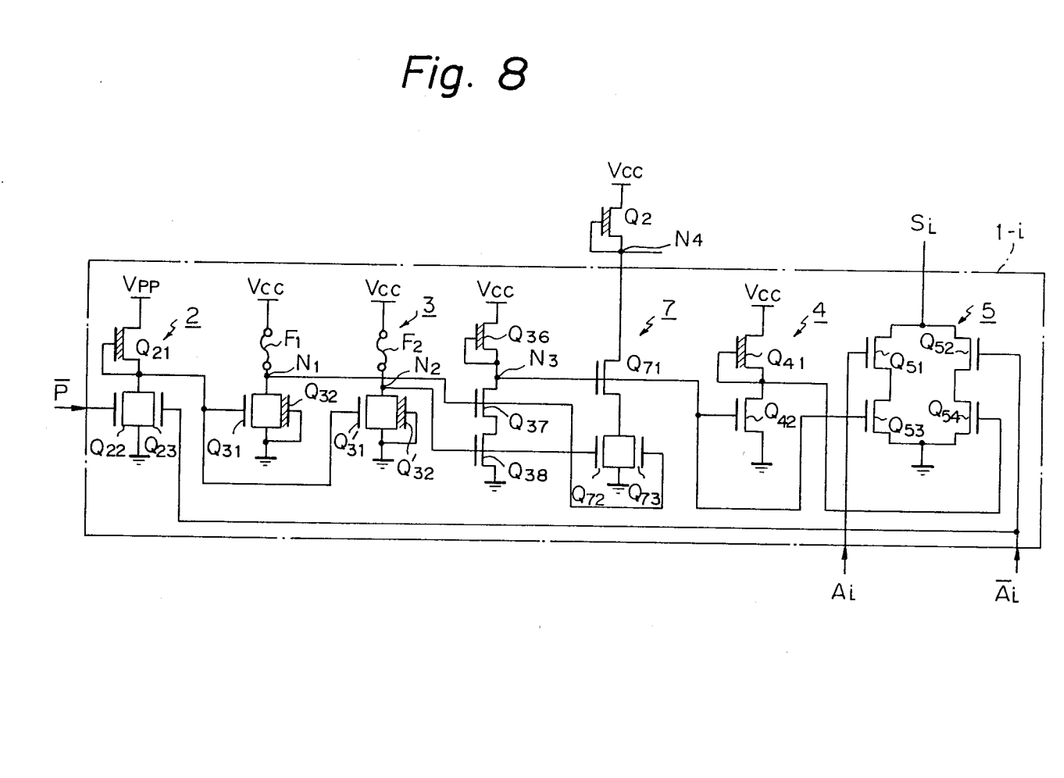
FIG. 8 is a circuit diagram of a fuse-type ROM including a third embodiment of the information storing circuit according to the present invention.
Figure 9:
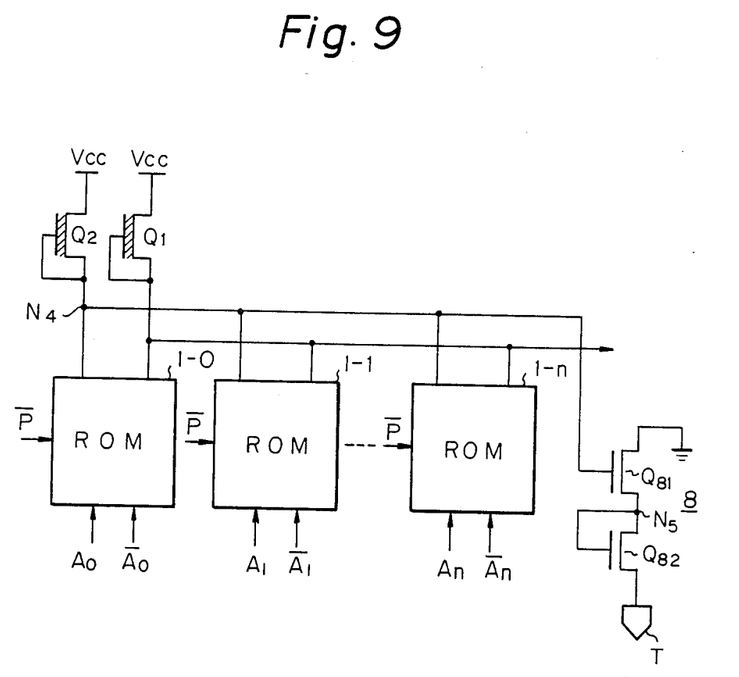
FIG. 9 is a block circuit diagram of a redundancy control circuit using the fuse-type ROM of FIG. 8.

In FIG. 8, which illustrates a third embodiment of the present invention, a determination circuit 7 formed by transistors $Q_{71}$, $Q_{72}$, and $Q_{73}$ is added to the elements of FIG. 6A. This determination circuit 7 is connected to the power supply terminal $V_{CC}$ via a depletion-type transistor $Q_2$ serving as a common load to the ROM's, as shown in FIG. 9. The operation of the determination circuit 7 will be explained. When the fuses $F_1$ and $F_2$ are both in an unblown state, the potentials at the nodes $N_1$ and $N_2$ are both high. Accordingly, the transistors $Q_{72}$ and $Q_{73}$ are both in an on state. In addition, in this case, the potential at the node $N_3$ is low. Accordingly, the transistor $Q_{71}$ is in an off state, so that the determination circuit 7 disconnects the node $N_4$ from the ground.

When one of the fuses, such as $F_1$, is in an unblown state and the other, e.g., $F_2$, is in a blown state, the potential at the node $N_1$ is high and the potential at the node $N_2$ is low, so that the transistor $Q_{73}$ is in an on state and the transistor $Q_{72}$ is in an off state. In addition, the potential at the node $N_3$ is high. Accordingly, the transistor $Q_{71}$ is in an on state, so that the determination circuit 7 causes the potential at the node $N_4$ to be at the ground level.

Further, when the fuses $F_1$ and $F_2$ are both in a blown state, the potentials at the nodes $N_1$ and $N_2$ are both low. Therefore, the transistors $Q_{72}$ and $Q_{73}$ are both in an off state, so that the determination circuit 7 disconnects the node $N_4$ from the grounded terminal. Thus, the determination circuit 7 connects the node $N_4$ to the ground when only one fuse is in a blown state. In other words, the determination circuit 7 determines whether or not only one fuse is blown. Note the conductivity of the transistor $Q_2$ is adjusted so that the potential at the node $N_4$ is grounded when the determination circuit 7 in at least one of the ROM's determines that only one fuse is blown.

FIG. 9 is a block diagram of a redundancy control circuit including the ROM's of FIG. 8. That is, a circuit 8 is provided for transmitting the potential at the node $N_4$ to the exterior. This circuit 8 comprises two enchancement-type transistors $Q_{81}$ and $Q_{82}$. For example, in at least one of the ROM's 1-0 to 1-n, when a blown state in which only one fuse is blown is detected as a half-abnormal state, as explained above, the potential at the node $N_4$ is at the ground level. Accordingly, the potential at the node $N_5$ is $-V_{th}$ ($V_{th}$ is a threshold voltage of the transistors $Q_{81}$ and $Q_{82}$). Therefore, the potential at a pad terminal T is $-2$ $V_{th}$. On the other hand, if such a half-abnormal state is not generated, the potential at the node $N_4$ is $V_{CC}$. As a result, the potential at the node $N_5$ is 0, and the potential at the terminal T is $-V_{th}$. That is, the above-mentioned half-abnormal state can be discriminated at the exterior by detecting whether the potential at the terminal T is $-2$ $V_{th}$ or $-V_{th}$. For example, when detecting a voltage such as $-2$ $V_{th}$ or $-V_{th}$ at the terminal T, one terminal of a resistor having a value of about 500 kΩ is connected to the terminal T and a definite voltage which is, e.g., $-2$ V lower than $-2$ $V_{th}$—is applied to the other terminal of the resistor. Then, a voltage at the terminal T can be measured by a voltage measuring means.

The above-mentioned detection of such a half-abnormal state has the following three advantages. First, the rate of complete blowing of fuses is not always high due to the speciality of the blowing phenomenon. A product having a half-abnormal state has a low reliability, since the probability of change of another blown fuse to the unblown state is high. Products having such a half-abnormal state can be detected and removed by a detecting means in advance.

Second, when a product becomes half-abnormal during use, it is possible to exchange the detected half-abnormal products with normal products before the products become completely defective.

Third, the reliability of fuses itself can be detected by the detecting means. In addition, the reliability of products is a square value of the reliability of fuses. Therefore, the reliability of products over a long run can be theoretically obtained by the running of a small number of products over a short time period using the detection means.

Note that the determination circuit 7 can be applied to the embodiment of FIG. 7. In this case, the gate of the transistor $Q_{71}$ is connected to the node $N_4$, and the gates of the transistors $Q_{72}$ and $Q_{73}$ are connected to the fuses $F_1$ and $F_2$, respectively. In addition, in order to carry out blowing electrically, the programming circuits 2 and 2' are provided. However, if a laser blowing method is used, the programming circuit 2 (2') and the transistor $Q_{31}$ ($Q_{31}$) can be omitted. The connection of the transistors $Q_{53}$ and $Q_{54}$ of the address coincidence detecting circuit 5 is dependent upon the output polarity of the information storing circuit. That is, the connection of FIG. 2 is the same as that of FIG. 7, and the connection of FIG. 3 is the same as FIGS. 6A, 6B, 6C, and 6D (FIG. 8).

Figure 10:
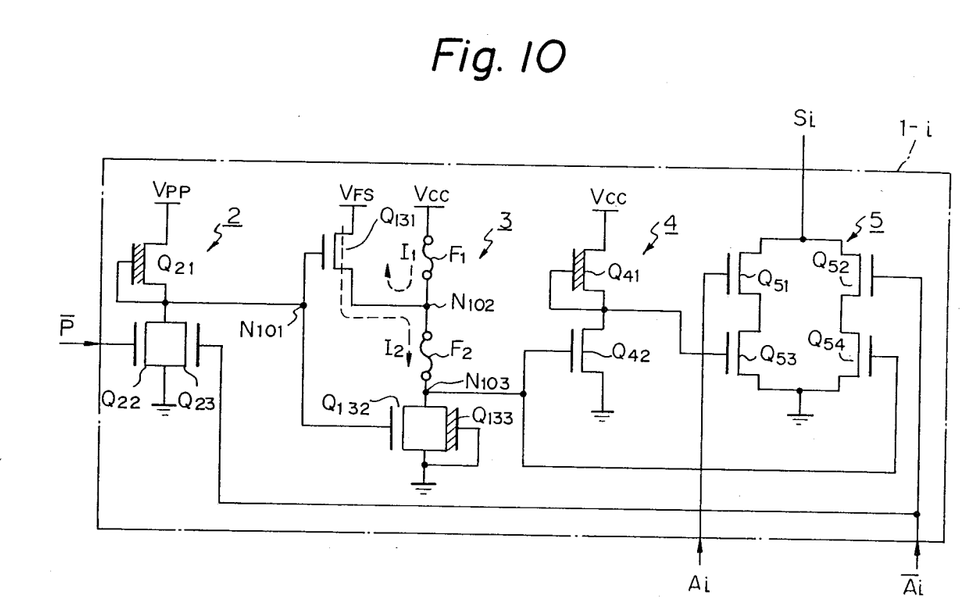
FIG. 10 is a circuit diagram of a fuse-type ROM including a fourth embodiment of the information storing circuit according to the present invention.

In FIG. 10, which illustrates a fourth embodiment of the present invention, the information storing circuit 3 comprises fuses $F_1$ and $F_2$ connected in series to each other, enhancement-type transistors $Q_{131}$ and $Q_{132}$, and a depletion-type transistor $Q_{133}$. That is, in the information storing circuit 3, there is no NAND circuit corresponding to the transistors $Q_{36}$, $Q_{37}$, and $Q_{38}$ as illustrated in FIG. 6A, thereby simplifying the circuit configuration.

During a blowing mode, the fuses $F_1$ and $F_2$ are blown separately. First, $V_{FS}$ is caused to be at the ground level. Then, when the signals $\overline{P}$ and $\overline{A}_i$ are both low so as to increase the potential at the node $N_{101}$, a large current indicated by $I_1$ flows through the fuse $F_1$, thereby blowing it. Second, $V_{FS}$ is made the same as $V_{CC}$. As a result, a large current indicated by $I_2$ flows through the fuse $F_2$, thereby blowing it.

After the above-mentioned blowing mode, when the fuses $F_1$ and $F_2$ are both in an unblown state, the potential at the node $N_{102}$ is high and the potential at the node $N_{103}$ is high.

When the fuse $F_1$ is in an unblown state and the fuse $F_2$ is in a blown state, the potential at the node $N_{102}$ is high but the potential at the node $N_{103}$ is low. Conversely, when the fuse $F_2$ is in an unblown state and the fuse $F_1$ is in a blown state, the potential at the node $N_{102}$ is low and the potential at the node $N_{103}$ is low.

Further, when the fuses $F_1$ and $F_2$ are both in a blown state, the potentials at the nodes $N_{102}$ and $N_{103}$ are both low. Thus, when one or both of the fuses $F_1$ and $F_2$ is in a blown state, the potential at the output node $N_{103}$ of the fuse circuit 3 is low. In other words, when writing data "1", blowing of one or more fuses means completion of the writing of data "1". In addition, when both the fuses $F_1$ and $F_2$ are blown, data "1" will not return to data "0" even if one fuse returns to an unblown state. That is, until both the fuses return to an unblown state, such data "1" will not return to data "0".

Thus, the logical output signal from the fuses is directly obtained at node $N_{103}$ without adding any logic gate circuit as in the preceeding embodiments.

Figure 11:
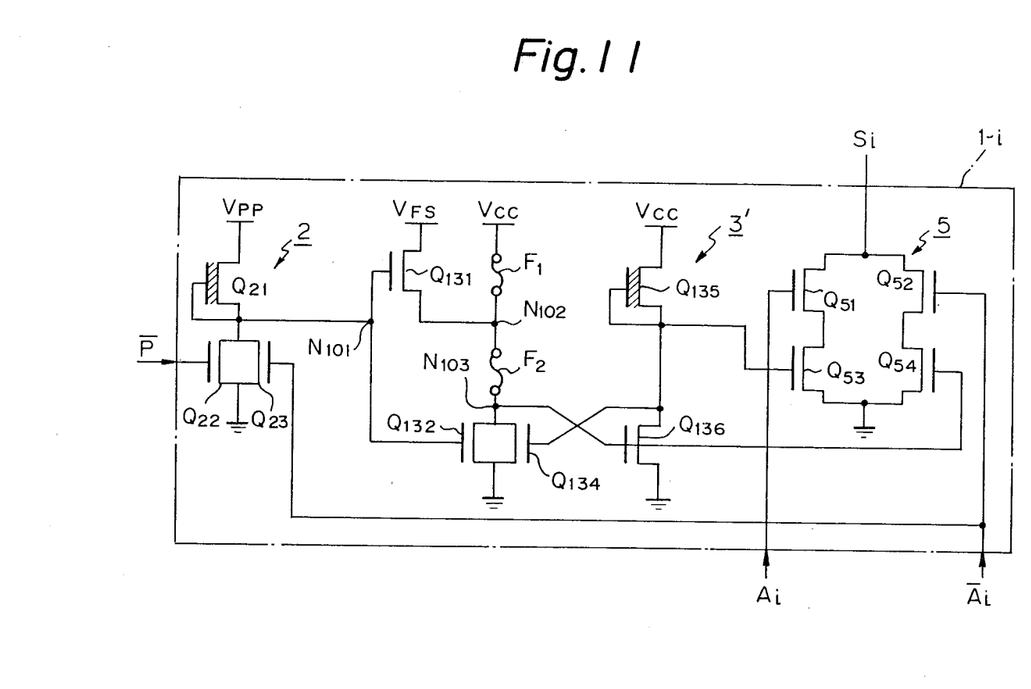
FIG. 11 is a circuit diagram of a fuse-type ROM including a fifth embodiment of the information storing circuit according to the present invention.

In FIG. 11, which illustrates a fifth embodiment of the present invention, the fuse circuit 3' has a latch configuration so as to increase the tolerance of the ratio of the blown and unblown resistance values of the fuses. That is, enhancement-type transistors $Q_{134}$ and $Q_{136}$, and depletion-type transistor $Q_{135}$ are provided instead of the depletion-type transistor $Q_{133}$ of FIG. 10. The blowing mode of the fuses of FIG. 11 is the same as that of FIG. 10. Also, in the circuit of FIG. 11, when at least one of the fuses $F_1$ and $F_2$ is in a blown state, the potential at the output node $N_{103}$ of the fuse circuit 3' is low.

Note that the modification as illustrated in FIG. 6B can be also applied to the embodiment of FIG. 10.

According to the present invention, since the probability of change of the write state from "1" to "0" can be made very small, the reliability of the information storing circuit can be remarkably improved.

Although the description has been made in regard to the memory device having redundant memory cells and a redundant control circuit, the information storing circuit of the present invention can be also applicable to other devices such as an integrated circuit device having a trimming circuit for adjusting characteristics of internal elements after its manufacturing process to compensate the fluctuation due to the process. Such a trimming circuit may be comprised of trimming elements and the information storing circuit as described which determines the addition or deletion of the trimming elements upon testing.

We claim:
1. A circuit for storing information by blown and unblown fuses, comprising:
first and second power supply terminals;

fuse circuit means, operatively connected between said first and second power supply terminals, said fuse circuit means comprising at least two fuses each of which is capable of taking one of blown and unblown states, said at least two fuses for storing information; and information output means, operatively connected to said fuse circuit means, for providing an output representing the stored information by discriminating between the state in which all of said at least two fuses are unblown and the state in which at least one of said at least two fuses is blown.

2. A circuit as set forth in claim 1, wherein said fuse circuit means comprises at least two fuse circuits operatively connected in parallel between said first and second power supply terminals, each of said at least two fuse circuits including one of said at least two fuses.

3. A circuit as set forth in claim 2, wherein each of said at least two fuses is connected to said first power supply terminal, and wherein each of said at least two fuse circuits further comprises a load operatively connected between the corresponding one of said at least two fuses and said second power supply terminal.

4. A circuit as set forth in claim 3, wherein said load comprises a depletion type transistor having a drain connected to the corresponding one of said at least two fuses, having a source, and having a gate connected to the source.

5. A circuit as set forth in claim 3, wherein said load comprises an enhancement-type transistor having a drain connected to the corresponding one of said at least two fuses, having a source connected to said second power supply terminal, and having a gate for receiving a predetermined voltage lower than the voltage supplied at the first power supply terminal.

6. A circuit as set forth in claim 3, further comprising programming means operatively connected to said at least two fuse circuits, for blowing said at least two fuses simultaneously.

7. A circuit as set forth in claim 3, further comprising a plurality of programming means respectively, operatively connected to said at least two fuse circuits, for blowing said at least two fuses separately.

8. A circuit as set forth in claim 3, further comprising:
a resistor operatively connected between said first power supply terminal and said at least two fuses; and
a terminal, operatively connected to said at least two fuses, for receiving a higher potential than the potential of said first power supply terminal when said circuit is in a blowing mode.

9. A circuit as set forth in claim 3, wherein said information output means comprises a NAND circuit having first and second inputs respectively, operatively connected to the connections between said at least two fuses and said loads, and having output means, said NAND circuit discriminating between the blown and unblown states and providing the output representing the stored information at said output means of said NAND circuit.

10. A circuit as set forth in claim 2, wherein each of said at least two fuse circuits comprises a latch circuit operatively connected between said first and second power supply terminals, said latch circuit having the corresponding one of said at least two fuses as one load.

11. A circuit as set forth in claim 10, wherein said information output means comprises a NOR circuit having inputs respectively, operatively connected to the outputs of said latch circuits, and having output means, said NOR circuit discriminating between the blown and unblown states and providing the output representing the stored information at the output means of said NOR circuit.

12. A circuit as set forth in claim 2, further comprising a determination circuit operatively connected to said first and second power supply terminals, said at least two fuse circuits, and said information output means, for determining whether all or some of said at least two fuses are in the blown state.

13. A circuit as set forth in claim 12, wherein said determination circuit comprises:
a load operatively connected to said first power supply terminal;
a first enhancement-type transistor having a drain connected to said load, having a gate connected to the output of said information output means, and having a source; and
a plurality of second enhancement-type transistors, each having a drain connected to the source of said first enhancement-type transistor, having a gate connected to the output of a corresponding one of said at least two fuses circuits, and having a source connected to said second power supply terminal.

14. A circuit as set forth in claim 1, wherein said at least two fuses comprise two fuses and wherein said fuse circuit means comprises:
said two fuses connected in series to each other; and
a load operatively connected between said two fuses and said second power supply terminal.

15. A circuit as set forth in claim 14, further comprising programming means, operatively connected to said fuse circuit means, for blowing said two fuses separately.

16. A circuit as set forth in claim 15, wherein said load comprises a depletion-type transistor having a drain connected to one of said two fuses, having a source and having a gate connected to the source.

17. A circuit as set forth in claim 15, wherein said load comprises an enhancement-type transistor having a drain connected to one of said two fuses, having a source connected to said second power supply terminal, and having a gate for receiving a predetermined voltage lower than the voltage at said first power supply terminal.

18. A circuit as set forth in claim 1, wherein said fuse circuit means comprises a latch circuit operatively connected between said first and second power supply terminals, said latch circuit comprising two fuses connected in series to each other as one load.

19. A circuit as set forth in claim 18, further comprising programming means, operatively connected to said latch circuit, for blowing said two fuses separately.

* * * * *